(12) United States Patent
Takehana et al.

(10) Patent No.: US 6,300,707 B1
(45) Date of Patent: Oct. 9, 2001

(54) QUARTZ CRYSTAL UNIT

(75) Inventors: Sachiko Takehana; Mitsuaki Koyama; Shigeru Obara, all of Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 09/750,769

(22) Filed: Jan. 2, 2001

(30) Foreign Application Priority Data

Jul. 5, 2000 (JP) .................................................. 12-203667

(51) Int. Cl.[7] .................................................... H01L 41/08
(52) U.S. Cl. .......................... 310/348; 310/344; 310/320; 310/353
(58) Field of Search .................................. 310/353, 351, 310/346; H01L 41/04, 41/08, 41/18; H02N 2/00

(56) References Cited

U.S. PATENT DOCUMENTS

| | | | |
|---|---|---|---|
| 4,803,393 | * 2/1989 | Takahashi | 310/328 |
| 5,004,945 | * 4/1991 | Tomita | 310/328 |
| 5,900,691 | * 5/1999 | Reuter | 310/348 |
| 6,172,445 | * 1/2001 | Heinz | 310/328 |

* cited by examiner

*Primary Examiner*—Thomas M. Dougherty
(74) *Attorney, Agent, or Firm*—Oblon, Spivak, McClelland, Maier & Neustadt, P.C.

(57) ABSTRACT

A quartz crystal unit with favorable frequency variation characteristics in response to changes in temperature and changes over time. A pair of lead wires provided perpendicularly to a base and a pair of supporters supported on the pair of lead wires are used for holding and electrically connecting a quartz blank at opposite points on the periphery thereof to which leading electrodes extend. The orientation of a line connecting holding points matches an axis on which stress sensitivity of the quarts blank exhibits the least value. A line connecting both supporting points for the supporters by the lead wires is disposed in a skew position with respect to another line connecting both holding points for the quartz blank. When the quartz blank is AT cut, an angle formed between these lines in the skew relationship is preferably set to approximately 30 degrees.

8 Claims, 3 Drawing Sheets

QUARTZ CRYSTAL UNIT

BACKGROUND OF THE INVENTION

1. Field of the Invention

The present invention relates to a quartz crystal unit constructed by holding a quartz blank with supporters, and more particularly to a quartz crystal unit with favorable frequency stability characteristics in response to changes in temperature and long-term aging by avoiding stress applied to the quartz blank with the supporter.

2. Description of the Prior Art

A quartz crystal unit is widely used in various electronic equipment including communication devices as a reference source for frequency and time. The quartz crystal unit is formed to include a quartz blank in a container, and one of such elements is a quartz crystal unit which holds a quartz blank with a pair of supporters for providing high stability.

FIGS. 1 and 2 are diagrams showing a configuration of a conventional quartz crystal unit. FIG. 1 is a vertical section view of the quartz crystal unit, while FIG. 2 is a plan view showing the quartz crystal unit from which a metallic cover of a container is removed.

The quartz crystal unit is configured to hermetically seal quartz blank 4 held by a pair of supporters 3a, 3b in a container comprising metallic base 1 and metallic cover 2. A pair of lead wires 6a, 6b pass through metallic base 1. Glass 5 is formed for sealing at the portions where lead wires 6a, 6b pass through base 1 to maintain electrical insulation between lead wires 6a, 6b and metallic base 1. Lead wires 6a, 6b are also referred to as hermetic terminals. Supporters 3a, 3b are formed as metallic members in L-shape, and the horizontal portions of supporters 3a, 3b are spot welded to the ends of lead wires 6a, 6b, respectively, such that the vertical portions thereof are opposite to each other.

Quartz blank 4 is an AT cut type in discoid shape, and as shown in FIG. 3, provided with excitation electrodes 7a, 7b formed on both major surfaces, respectively, and leading electrodes 8a, 8b extending from excitation electrodes 7a, 7b to the end surfaces at the opposite points on the periphery. Leading electrodes 8a, 8b are extended to the ends of quartz blank 4 and then folded back to the opposite surface for a predetermined length.

In FIG. 3, three axes, i.e., X, Y' and Z' axes are depicted. The X axis is crystallographically determined in quartz and exhibits the largest stress sensitivity, while the Y' axis indicates a direction perpendicular to the plane on which the quartz blank is cut with the AT cut. The direction in which leading electrodes 8a, 8b extend is inclined approximately 30 degrees toward the Z' axis. In this direction, the stress sensitivity in quartz blank 4 exhibits the smallest value. In other words, the quartz blank 4 is most insensitive against stress in this direction.

The end surfaces of leading electrodes 8a, 8b at the opposite points on the periphery of quartz blank 4 are abutted against the vertical portions of supporters 3a, 3b, and electrically and mechanically connected thereto with thermo-compression bonding, thereby holding quartz blank 4 by supporters 3a, 3b such that the major surfaces of quartz blank 4 is horizontally disposed with respect to metallic base 1. The vertical portions of supporters 3a, 3b are covered with metallic foils made from eutectic alloy of gold (Au) and germanium (Ge), not shown.

In such a quartz crystal unit, since the quartz blank is held at the opposite points on the periphery on the axis on which the stress sensitivity is least, it is possible to reduce changes in frequency in response to stress from the opposite points on the periphery. In addition, since the end surfaces at the opposite points on the periphery are held, favorable oscillation characteristics can be achieved without inhibiting oscillation displacements of the major surfaces. For these reasons, a configuration of this type is often employed especially in a high-stability quartz crystal unit which is accommodated and driven in a thermostatic bath for making frequency-temperature characteristics flat, for example.

In the quartz crystal unit with the aforementioned configuration, however, the supporting points for supporters 3a, 3b to metallic base 1, i.e. the positions where the aforementioned spot welding is performed, and the holding points for quartz blank 4 by supporters 3a, 3b are placed on the same straight line when viewed from above quartz blank 4, and the line passes through the central portion of quartz blank 4 which is a principal oscillation area. Thus, the axes on which supporters 3a, 3b expand and contract with changes in temperature and over time lie on the same line, and expansion and contraction forces locally concentrate to apply stress to quartz blank 4, causing variations in oscillation frequency of the quartz crystal unit.

Particularly, while a high-stability quartz crystal unit requires frequency stability on the order of ppb ($10^{-9}$), the use of the aforementioned conventional configuration may lead to insufficient characteristics in terms of changes over time. When the opposite points on the periphery where the stress sensitivity is least are held, the portions of supporters 3a, 3b abutting against quartz blank 4 have a certain planar area, that is, the opposite points where the sensitivity is least are not held in spots. This is the reason the aforementioned configuration causes frequency changes due to stress.

SUMMARY OF THE INVENTION

It is an object of the present invention to provide a quartz crystal unit with favorable frequency stability characteristics in response to changes in temperature and changes over time.

The aforementioned object of the present invention is achieved by a quartz crystal unit which comprises a container including a base and a cover, a pair of sustaining members provided perpendicularly to the base, a pair of supporters supported by the pair of sustaining members, and a quartz blank held by the pair of supporters such that a major surface of the quartz blank is parallel to the base and hermetically sealed in the container, wherein the quartz blank includes excitation electrodes provided on both major surfaces, respectively, and a pair of leading electrodes extending on the major surfaces from the excitation electrodes to points on the periphery of the quartz blank in opposite directions to each other, the points on the periphery to which the leading electrodes extend serve as holding points, the quartz blank is electrically and mechanically connected to the pair of supporters by bonding a pair of the holding points to the pair of supporters, and a first line connecting the supporting points for supporting the pair of supporters by the pair of sustaining members is in a skew relationship with a second line connecting the pair of holding points.

In the present invention, since the first line connecting the supporting points for the pair of supporters by the pair of sustaining members is in the skew relationship with the second line connecting the pair of holding points, the directions in which the supporters expand and contract are not placed on the same line but are disposed differently from each other, thereby preventing stress due to expansion and contraction of the supporters from concentrating in the quartz blank. This reduces frequency change in the quartz crystal unit due to stress.

DESCRIPTION OF THE PREFERRED EMBODIMENT

Figure 1:
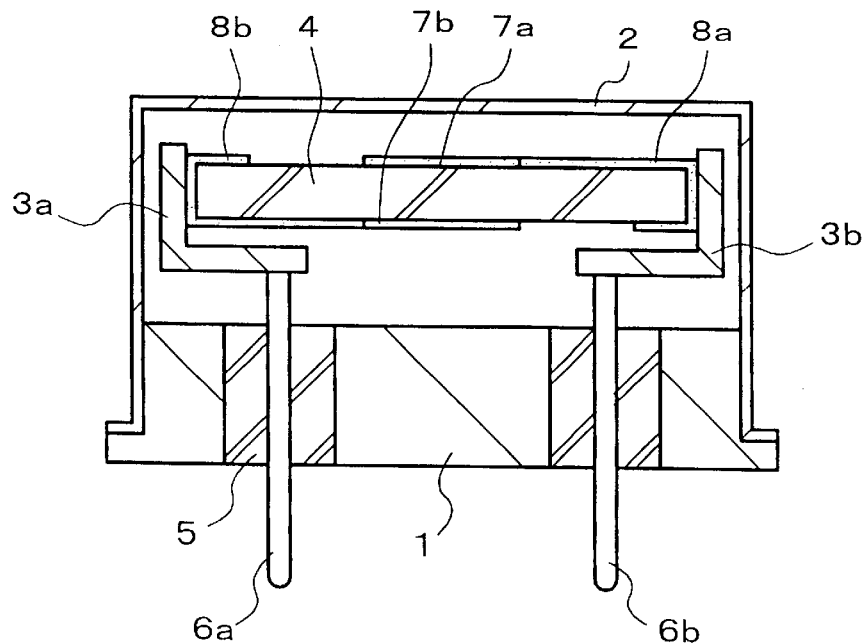
FIG. 1 is a section view showing a configuration of a conventional quartz crystal unit.
Figure 2:
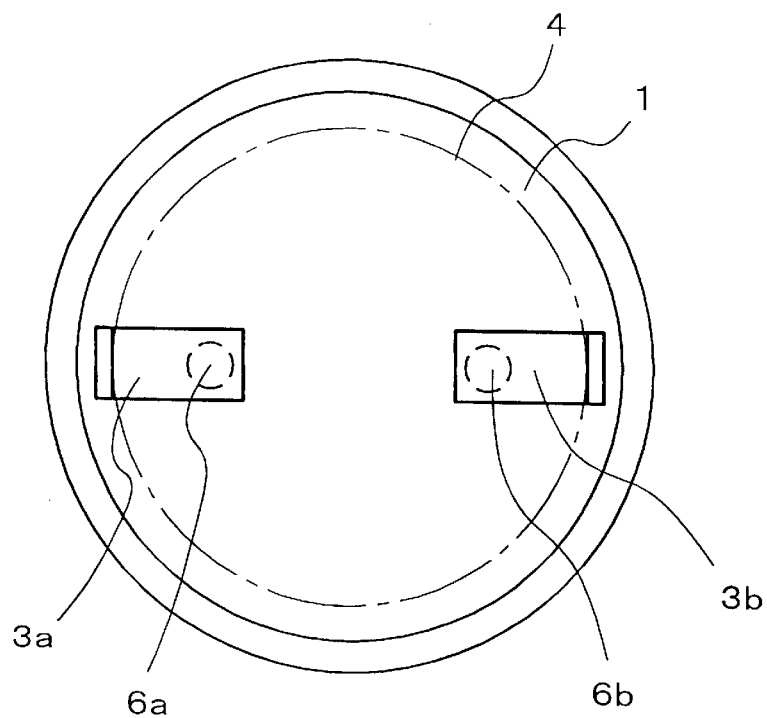
FIG. 2 is a plan view showing the conventional quartz crystal unit from which a metallic cover is removed.
Figure 3:
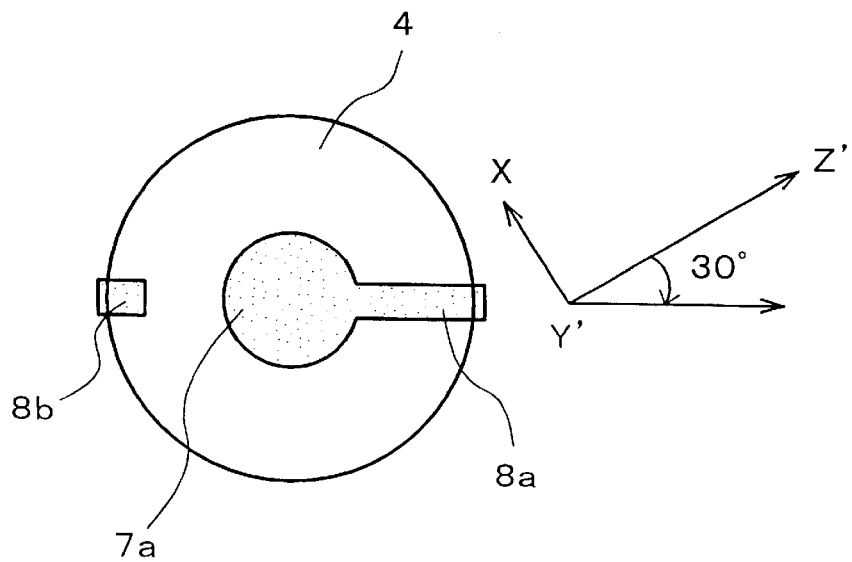
FIG. 3 is a plan view showing a configuration of a quartz blank.
Figure 4:
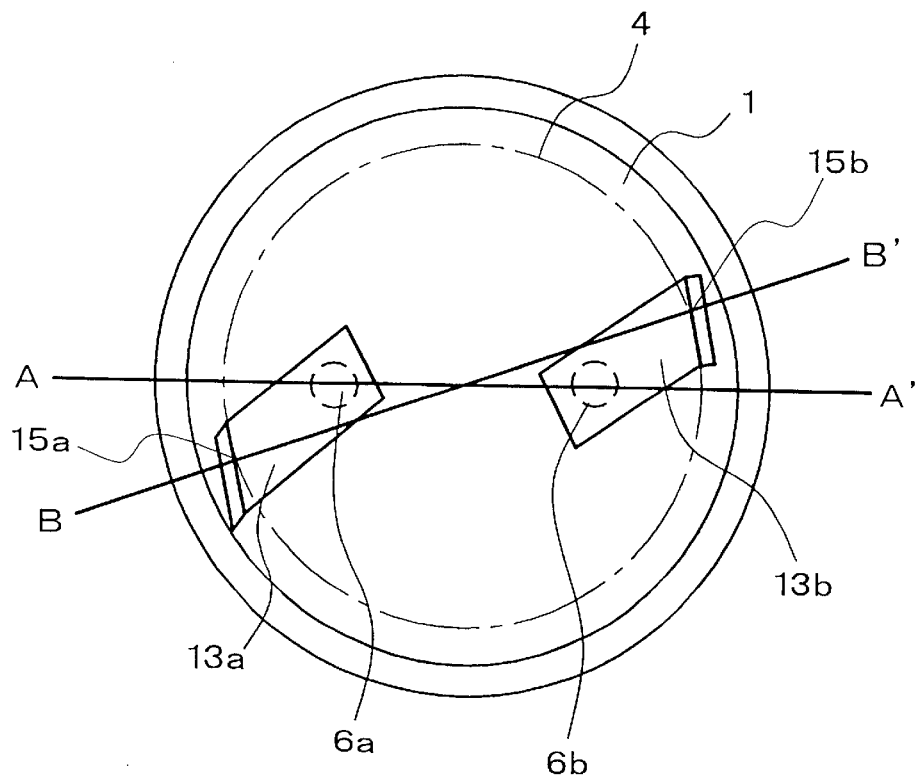
FIG. 4 is a plan view showing a quartz crystal unit according to a preferred embodiment of the present invention from which a metallic cover is removed.
Figure 5:
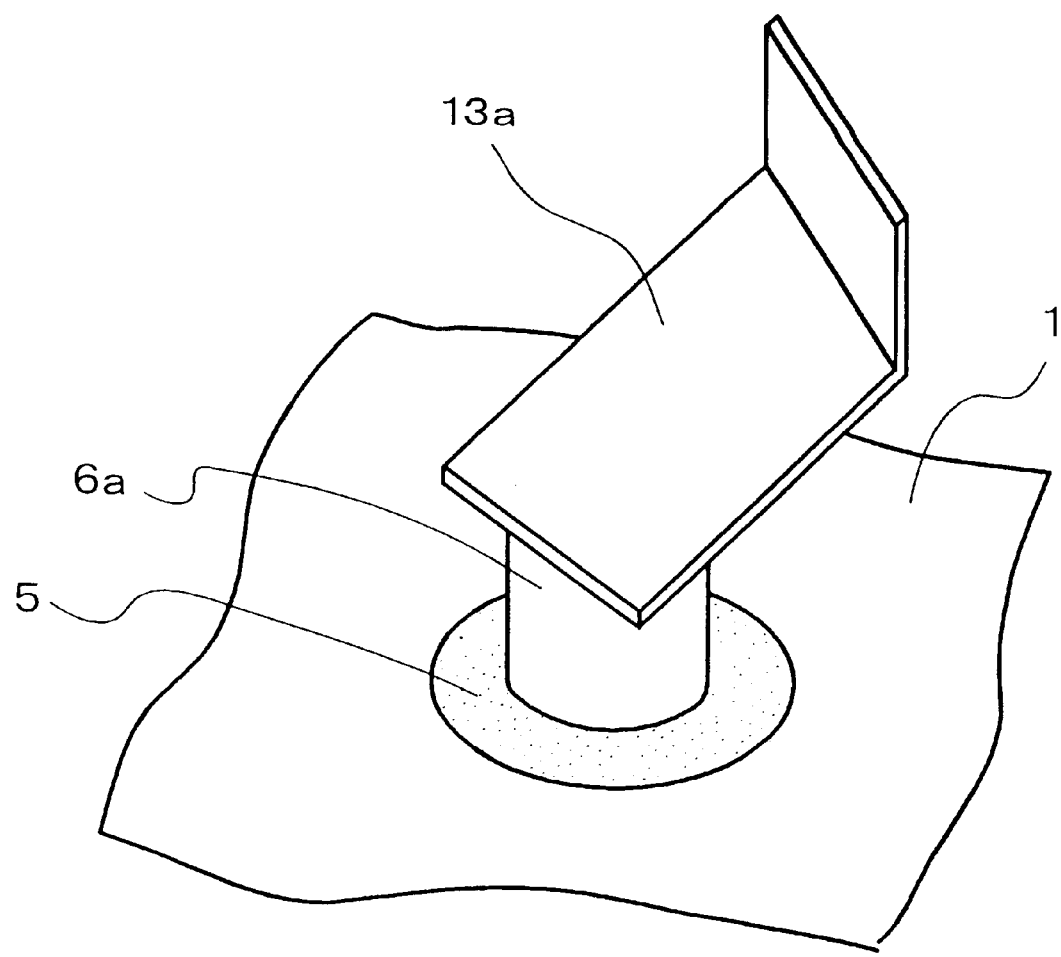
FIG. 5 is a partial perspective view showing the shape of a supporter and the attachment thereof in the quartz crystal unit shown in FIG. 4.

A quartz crystal unit of a preferred embodiment of the present invention shown in FIGS. 4 and 5 differs from the conventional quartz crystal unit shown in FIGS. 1 to 3 in the shapes of a pair of supporters for holding a quartz blank to thereby provide a different arrangement of the quartz blank, the pair of supporters and a pair of lead wires in relation to one another. In FIGS. 4 and 5, the components designated with the reference numerals identical to those in FIGS. 1 to 3 are the same as those in FIGS. 1 to 3, and the detailed description thereof is not repeated.

The quartz crystal unit is formed to hermetically seal quartz blank 4 in discoid shape in a container comprising metallic base 1 and cover 2. Metallic base 1 is provided with a pair of lead wires 6a, 6b as sustaining members which pass through metallic base 1 but are electrically insulated therefrom by glass 5. Supporters 13a, 13b in L-shape made from metallic materials are attached to the ends of lead wires 6a, 6b, respectively. Lead wires 6a, 6b extend substantially vertically to metallic base 1 with an interval between them smaller than the diameter of quartz blank 4.

Leading electrodes 8a, 8b extend from excitation electrodes 7a, 7b provided on both major surfaces of quartz blank 4 to the opposite points on the periphery of quartz blank 4. Leading electrodes 8a, 8b extend in directions opposite to each other and are bonded to supporters 13a, 13b at the end surfaces on the periphery of quartz blank 4. The bonding points serve as holding points for quartz blank 4. Quartz blank 4 are thus connected electrically and mechanically to supporters 13a, 13b and horizontally held. Leading electrodes 8a, 8b extend in a direction where stress sensitivity exhibits the least value, i.e. in a direction inclined approximately 30 degrees toward the Z' axis.

As described above, paired supporters 13a, 13b are similar to supporters 3a, 3b shown in FIGS. 1 and 2, but have different shapes. Each of supporters 13a, 13b in L-shape has a horizontal portion and a vertical portion extending upright from the end of the horizontal portion. Supporters 13a, 13b are disposed such that the inner surfaces of the vertical portions face each other. The inner surfaces of the vertical portions are provided with metallic foils (not shown) made from Au—Ge eutectic alloy for forming the electrical and mechanical bonding to leading electrodes 8a, 8b of quartz blank 4. In FIG. 4, in the bonding portions of quartz blank 4 to supporters 13a, 13b, the central points of those bonding portions are designated with numerals 15a, 15b, respectively.

Supporters 13a, 13b are spot welded to the ends of lead wires 6a, 6b, respectively, at the lower surfaces of the horizontal portions. The positions of the spot welding or supporting points are near the ends of the horizontal portions farther from the vertical portions. Assuming that the line connecting both supporting points is the line A–A', and that the line connecting the holding points for quartz blank 4 is the line B–B', these lines are not parallel to each other but are skewed. The holding points serving as areas for bonding quartz blank 4 to the supporters for holding have planar areas to some degree, but in this case, the positions of the holding points are defined as central points 15a, 15b of the bonding portions to both supporters 13a, 13b, respectively.

As a result, the direction in which leading electrodes 8a, 8b extend on quartz blank 4 is not the same as the direction in which the horizontal portions of supporters 13a, 13b extend from the supporting points to the vertical portions toward the periphery of quartz blank 4. The line A-A' and the line B-B' are parallel to the major surfaces of quartz blank 4, and if these lines are projected onto the major surface of quartz blank 4, the angle formed by both lines is approximately 30 degrees.

The vertical portions of supporters 13a, 13b are folded back along the tangent direction of the periphery of quartz blank 4 at central points 15a, 15b such that the midpoints of the vertical portions of supporters 13a, 13b in width direction serve as central points 15a, 15b of the bonding portions to quartz blank 4 in discoid shape. Therefore, as typically shown in FIG. 5, the side serving as the boundary between the horizontal portion and the vertical portion is not perpendicular to the direction in which the horizontal portion extends.

With the use of such a configuration, in the quartz crystal unit according to this embodiment, the directions in which respective supporters 13a, 13b expand and contract due to changes in temperature, changes over time or the like are not placed on the same line but lie to avoid the central portion of quartz blank 4 serving as a principal oscillation area. Thus, stress applied to quartz blank 4 due to the expansion and contraction of supporters 13a, 13b or the like is scattered to suppress frequency variations due to the expansion and contraction of supporters 13a, 13b. For this reason, especially when the quartz crystal unit is formed as a high-stability quartz crystal unit which is used in a thermostatic oven, it is possible to maintain high stability with a frequency change rate on the order of ppb ($10^{-9}$) or lower and to obtain a quartz crystal unit with favorable frequency stability characteristics in response to changes in temperature and changes over time.

While the preferred embodiment of the present invention has been described with an example of the application to a so-called high-stability quartz crystal unit, it goes without saying that the present invention is applicable to a quartz crystal unit for general use which uses no thermostatic oven and the like.

In addition, while the description has been made with an example of thermo-compression bonding using the eutectic alloy as a method of bonding the supporters to the quartz blank, the bonding method is not limited thereto. For example, the present invention is applicable to a bonding method in which the opposite points on the periphery of the quartz blank are held with a conductive adhesive such that it overflows to the major surface.

The orientation of the holding points for the quartz blank is not limited to approximately 30 degrees toward the Z' axis. For example, both ends of the X axis may be held.

When the present invention is applied to a quartz crystal unit which uses both ends of the X axis as the holding points, significant effects are obtained when it is used for high stability one requiring frequency variations on the order of ppb or lower. The quartz blank is not limited to one of AT cut, and the present invention is applicable to a quartz blank of SC cut with favorable stress sensitivity characteristics. In addition, the present invention is also applicable when a base for surface mounting made from ceramic, resin or the like is used instead of a metallic base and supporters made from metal are provided.

As described above, according to the present invention, the arrangement relationship between the pair of supporters for holding the quartz blank and the quartz blank is defined such that the line connecting the bonding portions of the supporters to the quartz blank is placed in a skew position with respect to the line connecting the supporting points for the supporters, thereby making it possible to provide a quartz crystal unit with favorable frequency stability characteristics in response to changes in temperature and changes over time.

What is claimed is:

1. A quartz crystal unit comprising:
    a container including a base and a cover;
    a pair of sustaining members provided perpendicularly to said base;
    a pair of supporters supported by said pair of sustaining members; and
    a quartz blank held by said pair of supporters such that a major surface of said quartz blank is parallel to said base and hermetically sealed in said container,
    wherein said quartz blank includes excitation electrodes provided on both major surfaces, respectively, and a pair of leading electrodes extending on said major surfaces from said excitation electrodes to points on periphery of said quartz blank in opposite directions to each other,
    the points on said periphery to which said leading electrodes extend serve as holding points, and said quartz blank is electrically and mechanically connected to said pair of supporters by bonding a pair of the holding points to said pair of supporters, and
    a first line connecting supporting points for supporting said pair of supporters by said pair of sustaining members is in a skew relationship with a second line connecting said pair of holding points.

2. The quartz crystal unit according to claim 1, wherein each of said supporters is of L-shape including a horizontal portion and a vertical portion extending upright from said horizontal portion, said supporter is supported at said horizontal portion by said sustaining member, and inner surface of said vertical portion is bonded to said holding point.

3. The quartz crystal unit according to claim 1, wherein said pair of sustaining members are a pair of lead wires passing through said base.

4. The quartz crystal unit according to claim 1, wherein said quartz blank is of discoid shape and an interval between said pair of sustaining members is smaller than a diameter of said quartz blank.

5. The quartz crystal unit according to claim 4, wherein said quartz blanks is an AT cut quartz blank, and positions of said pair of holding points are both ends of an axis on which stress sensitivity in said quartz blank exhibits substantially least value.

6. The quartz crystal unit according to claim 1, wherein an angle formed between said first line and said second line in the skew relationship is 30 degrees.

7. The quartz crystal unit according to claim 5, wherein an angle formed between said first line and said second line in the skew relationship is 30 degrees.

8. The quartz crystal unit according to claim 3, wherein said base is a metallic base, and said pair of lead wires are insulated from said metallic base with an insulating member.

* * * * *